United States Patent [19]

Papadopoulos

[11] Patent Number: 5,379,456
[45] Date of Patent: Jan. 3, 1995

[54] MULTIPLYING SAW PHASE SHIFT ENVELOPE DETECTOR

[75] Inventor: Costas Papadopoulos, Acton, Mass.

[73] Assignee: Whistler Corporation, Westford, Mass.

[21] Appl. No.: 650,950

[22] Filed: Feb. 5, 1991

[51] Int. Cl.[6] .............................................. H04B 1/08
[52] U.S. Cl. ................................... 455/318; 455/337; 455/339; 329/358; 329/363
[58] Field of Search .............. 455/214, 313, 318, 337, 455/339; 329/348, 358, 363; 333/150

[56] References Cited

U.S. PATENT DOCUMENTS

| | | | |
|---|---|---|---|
| 3,714,594 | 1/1973 | Adler et al. | 333/150 |
| 3,873,858 | 3/1975 | Burke et al. | 333/150 |
| 3,936,751 | 2/1976 | Holmes et al. | 455/214 |
| 3,946,148 | 3/1976 | Skerlos | 455/258 |
| 3,962,652 | 6/1976 | Zarin et al. | 333/150 |
| 4,017,798 | 4/1977 | Gordy et al. | 375/1 |
| 4,039,749 | 8/1977 | Gordy et al. | 375/115 |
| 4,053,889 | 11/1977 | Johnson | 342/201 |
| 4,054,841 | 10/1977 | Henaff et al. | 333/150 |
| 4,114,116 | 9/1978 | Reeder | 333/150 |
| 4,169,286 | 11/1979 | Uzunoglu et al. | 364/821 |
| 4,186,349 | 1/1980 | Gordy et al. | 375/102 |
| 4,207,545 | 6/1980 | Grudkowski et al. | 333/150 |
| 4,207,546 | 6/1980 | Grudkowski | 333/152 |
| 4,210,900 | 7/1980 | Shavit | 340/543 |
| 4,247,903 | 1/1981 | Grudkowski et al. | 364/821 |
| 4,291,409 | 9/1981 | Weinberg et al. | 375/1 |
| 4,300,235 | 11/1981 | Outram | 375/1 |
| 4,305,156 | 12/1981 | Ito et al. | 455/170.1 |
| 4,305,158 | 12/1981 | Fujishima et al. | 455/187.1 |
| 4,308,552 | 12/1981 | Hosoya | 358/39 |
| 4,312,228 | 1/1982 | Wohltjen | 73/597 |
| 4,408,347 | 10/1983 | Ash | 455/179.1 |
| 4,408,348 | 10/1983 | Theriault | 455/180.1 |
| 4,425,634 | 1/1984 | Iino et al. | 367/120 |
| 4,443,801 | 4/1984 | Klose et al. | 342/442 |
| 4,581,643 | 4/1986 | Carlson | 358/191.1 |
| 4,583,047 | 4/1986 | Le Goff epouse Henaff | 329/304 |
| 4,584,715 | 4/1986 | Baarset al. | 455/302 |
| 4,660,164 | 4/1987 | Leibowitz | 364/728.03 |
| 4,663,746 | 5/1987 | DeMaria et al. | 367/119 |
| 4,682,174 | 7/1987 | Richmond et al. | 342/160 |
| 4,703,327 | 11/1987 | Rossetti et al. | 342/44 |
| 4,704,737 | 11/1987 | Estrick et al. | 455/226.1 |
| 4,734,698 | 3/1988 | Nysen et al. | 342/44 |
| 4,737,930 | 4/1988 | Constant | 364/841 |
| 4,739,290 | 4/1988 | Minarik et al. | 333/152 |
| 4,749,964 | 6/1988 | Ash | 331/107 A |
| 4,754,449 | 6/1988 | Crookshanks | 370/70 |
| 4,764,736 | 8/1988 | Usui et al. | 330/294 |
| 4,812,850 | 3/1989 | Gunton et al. | 342/22 |
| 4,891,649 | 1/1990 | Labaar et al. | 342/203 |
| 4,945,313 | 7/1990 | Bricka et al. | 455/337 |
| 4,961,206 | 10/1990 | Tomlinson et al. | 375/39 |
| 4,969,159 | 11/1990 | Belcher et al. | 375/1 |
| 4,998,261 | 3/1991 | van Drisest et al. | 455/214 |

*Primary Examiner*—Reinhard J. Eisenzopf
*Assistant Examiner*—Andrew Faile
*Attorney, Agent, or Firm*—Weingarten, Schurgin, Gagnebin & Hayes

[57] ABSTRACT

A radio-frequency detection apparatus including a signal input for providing an input signal and a phase shifter having a first connection and a second connection. The phase shifter includes a SAW device having a first electrical connection and a second electrical connection, wherein the SAW first electrical connection is coupled to the phase shifter first connection and the SAW second electrical connection is coupled to the phase shifter second connection. The radio-frequency detection apparatus also includes a multiplier having a multiplier first input connection, a multiplier second input connection and at least one multiplier output connection, the multiplier first input connection being coupled to the signal input and the phase shifter first connection and the multiplier second input connection being coupled to the phase shifter second connection. The phase shifter introduces approximately a 90 degree phase shift into the input signal at approximately the frequency of minimum insertion loss.

13 Claims, 5 Drawing Sheets

MULTIPLYING SAW PHASE SHIFT ENVELOPE DETECTOR

FIELD OF THE INVENTION

The invention relates to the field of amplitude modulation detection.

BACKGROUND OF THE INVENTION

One manner in which information is transmitted by radio waves is by amplitude modulating a radio-frequency carrier. In amplitude modulation (AM) the intensity or envelope of the radio-frequency carrier varies or is modulated by an information signal. At a receiver, the inverse process of demodulating or removing the information signal from the carrier signal, termed detection, is performed. The device which performs this demodulation in the receiver is termed a detector.

An amplitude modulation receiver includes an antenna which receives radio-frequency electromagnetic waves and converts them into radio-frequency electrical signals. These radio-frequency electrical signals are passed to a filter stage which prevents all signals, except those whose frequencies which are of interest, from passing through the filter stage onto the detector stage. The detector stage removes the carrier frequency signal while retaining the information encoded in the modulated portion of the signal.

Since the radio-frequency spectrum is broad and since the filter stage and the detector stage are most easily constructed for, and most stable over, a narrow range of frequencies, the receiver just described is generally not used. Instead, the typical receiver heterodynes, or multiplies the received radio-frequency signal by a second signal, termed a local oscillator or LO signal, of a predetermined frequency, to produce an intermediate frequency or IF signal having a much lower frequency than the radio-frequency or rf signal. This IF signal is then detected or demodulated to produce an audio-frequency signal.

In this manner, by varying the frequency of the local oscillator signal multiplying the received rf signal, the frequency of the intermediate frequency signal produced can remain constant over a wide range of rf frequencies. Therefore, the filter stage and the detector stage can be optimized for a narrow band of intermediate frequencies.

In such a heterodyne or superheterodyne receiver, in addition to the above mentioned components, there is also included a local oscillator and a multiplier. The local oscillator is typically tunable, unless only one rf frequency is to be detected, and produces the predetermined local oscillator or LO frequency signal. The multiplier combines or heterodynes this predetermined local oscillator frequency signal with the radio-frequency signal to produce two intermediate frequency signals whose frequencies are the sum and difference of the radio-frequency signal frequency and the local oscillator signal frequency.

Typically, it is the difference intermediate frequency that is desired and the difference frequency is separated from the sum frequency by passing the signals from the multiplier through a filter, similar to what is done in the simple AM receiver. The filtered intermediate frequency signal is then passed to the detector for demodulation. Such envelope detection is not only suitable for AM demodulation, but is also useful in encoded data demodulation and for carrier detection in a swept receiver.

A problem arises that at high frequencies and narrow band widths, it is difficult to build stable filters and detectors. The present invention relates to a very stable detector for use in envelope detection.

SUMMARY OF THE INVENTION

A radio-frequency deflection apparatus is disclosed which includes a signal input for providing an input signal and a phase shifter having a first connection and a second connection; the phase shifter is coupled to a SAW device having a first electrical connection and a second electrical connection. The SAW first electrical connection is coupled to the phase shifter first connection and the SAW second electrical connection is coupled to the phase shifter second connection. The apparatus also includes a multiplier having a multiplier first input connection, a multiplier second input connection and at least one multiplier output connection. The multiplier first input connection is coupled to the signal input and the phase shifter first connection and the multiplier second input connection is coupled to the phase shifter second connection. The phase shifter is adapted for introducing approximately a 90 degree phase shift into the input signal at the frequency of minimum insertion.

A radio-frequency receiver is also disclosed which includes an antenna; a local oscillator multiplier having a local oscillator multiplier first input terminal, a local oscillator multiplier second input terminal and a local oscillator multiplier output terminal, the local oscillator multiplier first input terminal being coupled with the antenna; a local oscillator, the local oscillator being coupled with the local oscillator multiplier second input terminal; and a bandpass filter amplifier having a bandpass filter amplifier input terminal and a bandpass filter amplifier output terminal. The bandpass filter amplifier input terminal is coupled with the local oscillator multiplier output terminal. The receiver also includes a phase shifter having a first terminal and a second terminal, the phase shifter including a SAW device having a first electrical terminal and a second electrical terminal. The SAW first electrical terminal is coupled to the phase shifter first terminal and the SAW second electrical terminal is coupled to the phase shifter second terminal. The receiver further includes a phase shifter multiplier having a phase shifter multiplier first input terminal, a phase shifter multiplier second input terminal and at least one phase shifter multiplier output terminal. The phase shifter multiplier first input terminal is coupled to the signal input and the phase shifter first terminal and the phase shifter multiplier second input terminal is coupled to the phase shifter second terminal. The phase shifter is adapted for introducing approximately a 90 degree phase shift into the input signal at approximately the frequency of minimum insertion loss.

A method of demodulating radio-frequency signals is disclosed including the steps of receiving a radio-frequency signal, generating a local oscillator signal, multiplying the radio-frequency signal by the local oscillator signal to generate an intermediate frequency signal, filtering the intermediate frequency signal to generate a filtered intermediate signal having a predetermined frequency bandwidth, phase shifting the filtered intermediate signal by approximately 90 degrees at approximately the frequency of minimum insertion loss using a phase shifter including a SAW device, the SAW device having a resonant frequency substantially within the predetermined frequency bandwidth of the filtered intermediate signal, and multiplying the phase shifted filtered intermediate frequency signal by the filtered intermediate frequency signal to generate a demodulated output signal.

BRIEF DESCRIPTION OF THE DRAWINGS

A more complete understanding of the invention and the advantages thereof will be obtained by reference to the following detailed description in conjunction with the following drawings in which.

DESCRIPTION OF THE PREFERRED EMBODIMENT

Figure 1:
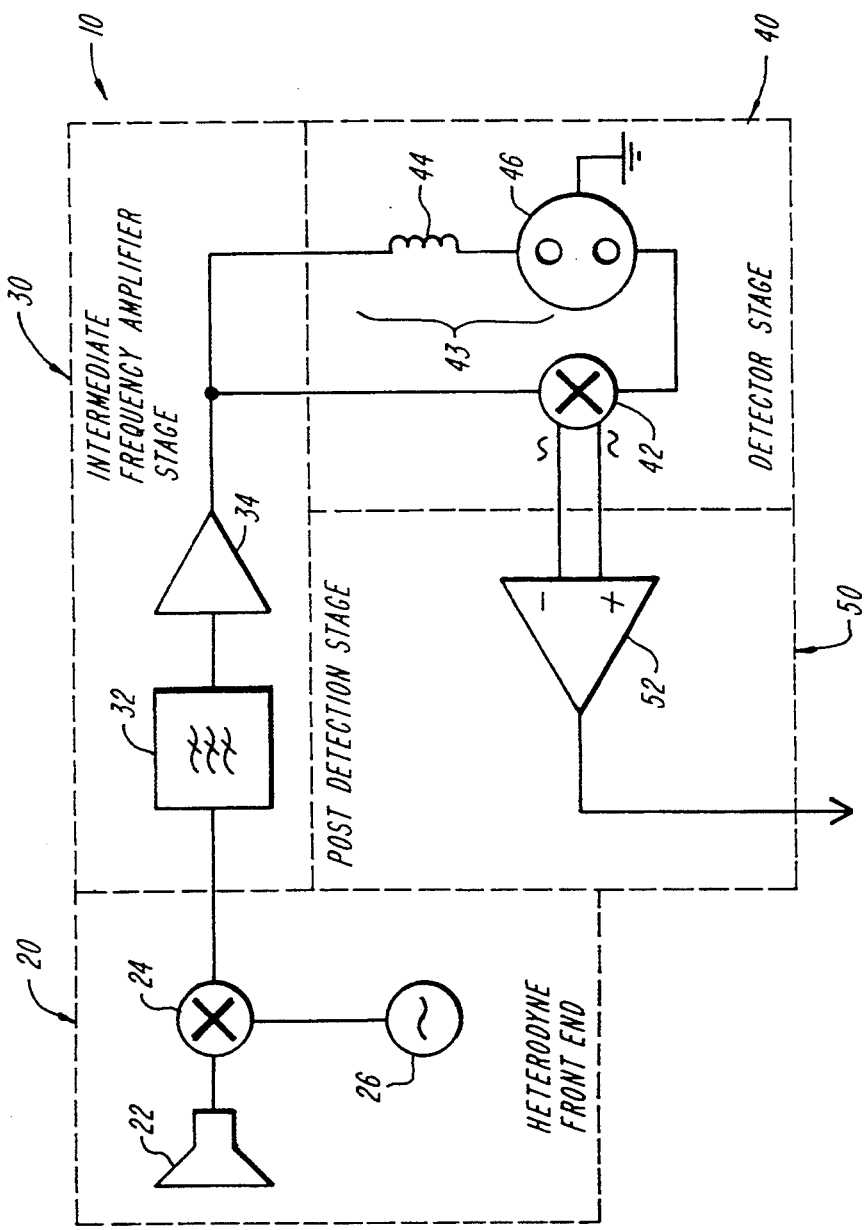
FIG. 1 is a block diagram of an embodiment of a receiver utilizing an embodiment of the invention.

In brief overview, an embodiment of a receiver 10 using an embodiment of the invention is shown in FIG. 1. The receiver 10 includes a heterodyne front end 20, an intermediate frequency amplifier stage 30, a detector stage 40 and a post-detection stage 50.

The heterodyne front end 20 includes a broad band antenna 22 which receives the radio-frequency electromagnetic waves and produces a radio-frequency electrical output signal which is an input signal to a multiplier 24. In the embodiment herein described, the antenna is a broadband horn antenna but other antennas may be used. Also, although the embodiment of the receiver herein described directly connects the antenna 22 to the multiplier 24, other receivers may utilize an rf amplifier, having suitable bandwidth, between the antenna and the multiplier. A local oscillator 26 produces an output local oscillator frequency signal which is a second input signal of the multiplier 24. In the embodiment shown, the local oscillator 26 sweeps from about 10.88 GHz-11.94 GHz. The output signal of the multiplier, which is of interest, is the frequency difference between the frequency of the radio-frequency signal generated in the antenna 22 and the local oscillator frequency generated by the oscillator 26. The local oscillator 26 may a variable or sweeping oscillator and may thereby be tuned to generate a constant intermediate frequency signal when multiplied with the radio-frequency signal, regardless of the frequency of the radio-frequency signal of interest received by the antenna 22.

The output signal of the heterodyne front end 20 is the input signal to a intermediate frequency amplifier 30. The intermediate frequency amplifier 30 has a narrow bandpass compared to the frequency of the radio-frequency signal received. The intermediate frequency amplifier 30 includes a bandpass filter 32 and an amplifier 34. Although depicted as a single amplifier 34, the intermediate frequency amplifier 30 is typically constructed as a series of filters and amplifiers to produce a sufficiently high gain to drive the detection stage. In the embodiment herein described, an alternating series of three amplifiers and four LC filters are used to produce a 60 dB gain. The intermediate frequency amplifier 30 is typically fixed, that is, non-tunable. In the embodiment described herein, the filter passes a central frequency of 385.5 MHz. It is the ability to tune the local oscillator 26 of the heterodyne front end 20 which permits the intermediate frequency amplifier 30 to be optimized to pass a single band of intermediate frequencies regardless of the frequency of the radio-frequency signals received by the antenna 22.

The filtered intermediate frequency output signal from the intermediate frequency amplifier 30 is the input signal to the detection stage 40. The output signal from the intermediate frequency amplifier 30 is one input of a multiplier 42 which forms part of the detection stage 40. The output signal from the intermediate frequency amplifier 30 is also the input signal to a 90 degree phase shifter 43 which forms the remaining portion of the detection stage 40. The phase shifter 43 includes, in one embodiment, a reactive element or elements, such as an inductor 44, connected in series with a surface acoustic wave (SAW) device 46. In the embodiment shown, the SAW device is coupled through an inductor to the signal input. The SAW device may alternatively be coupled to the rest of the circuit, directly, through AC coupling, or through any other suitable combination of components. The phase shifter 43 produces approximately a 90 degree phase shift in the input signal at approximately the frequency of minimum insertion loss.

In the embodiment shown, the SAW device resonates at approximately the central frequency of the filter stage 30 and has a minimum insertion loss at the frequency. In the embodiment shown, an inductor 44 is used as the reactive element, however, any reactive element or combination of reactive elements may be used. The 90 degree shifted signal formed by the phase shifter 43 is the second input signal to the multiplier 42.

The multiplier 42 produces two output signals which are opposite in phase and which are the input signals to the post-detection stage 50. In this embodiment the post-detection stage is a differential amplifier 52 which amplifies the difference between the two output signals produced by the multiplier 42 and suppresses common mode signals.

Figure 2:
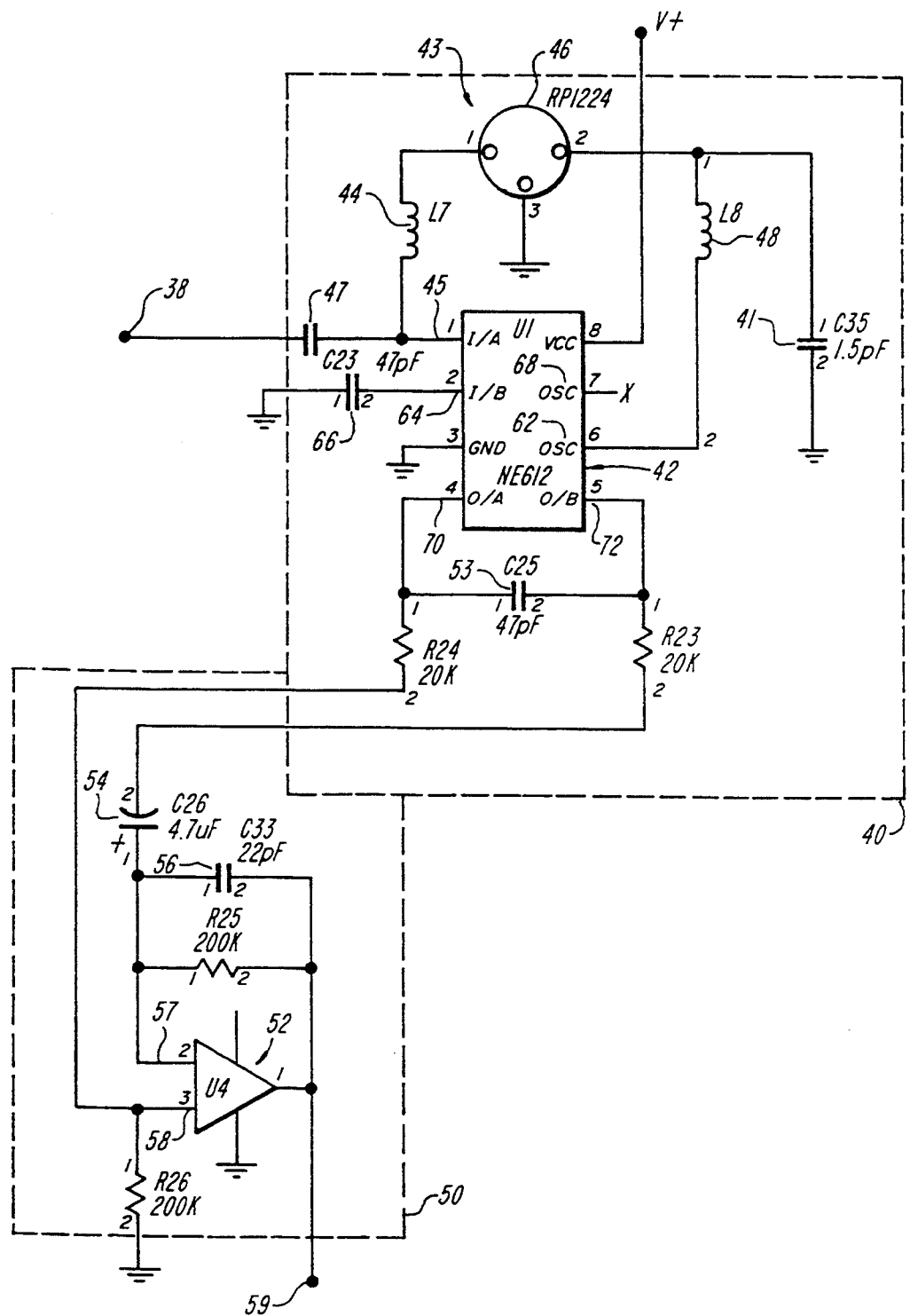
FIG. 2 is a schematic diagram of the embodiment of the invention in FIG. 1.

In more detail, a schematic of an embodiment of the detection stage 40 of the invention is shown in FIG. 2. The input signal 38 from the intermediate frequency amplifier 30 enters the detection stage 40 through a dc blocking capacitor 47. From the blocking capacitor 47, the input signal 38 is brought to an input terminal 45 of the multiplier 42. In the embodiment shown, the multiplier 42 is a double balanced mixer and oscillator integrated circuit used as a multiplier. This double balanced mixer and oscillator, designated NE612, is manufactured by Signetics, Inc., Sunyvale, Calif., and is shown schematically in FIG. 3. The input signal 38 from the intermediate frequency amplifier 30 is an input signal to one input terminal of the phase shifter 43.

In the embodiment shown, the phase shifter 43 includes the first reactive element, the inductor 44, in series with the SAW device 46, which is, in turn, in series with a second reactive element, an inductor 48. The input signal 38 enters the first reactive element 44, and the output signal of the reactive element 44, is the input signal to the input terminal of the SAW device 46. The output signal from the SAW device 46 is the input signal to a second reactive element 48. In the embodiment shown, the SAW device 46 has a resonant frequency at 385.53 MHz and is designated as a two port 180 degree phase shift SAW resonator, RP1224, by its manufacturer, RF Monolithics, Inc., Dallas, Tex.

The reactive element, in this embodiment inductors 44, 48, in conjunction with the SAW device., 46, produces a 90 degree phase shifted input signal at the frequency of minimum insertion loss. This phase shifted input signal is applied to an oscillator terminal 62 of a double balanced mixer and oscillator used as a multiplier 42. The reactive elements, in this embodiment inductors 44,48, provide multiple functions. First, the SAW device 46 has a low impedance at resonance and reactive elements 44,48, provide reactive impedance matching between the SAW device 46 and the multiplier 42 to lower the insertion loss. Second, the reactive elements 44,48, also act to broaden the bandwidth of the phase shifter 43. In the embodiment shown, the bandwidth is broadened in a 50 ohm system to 200 KHz from approximately 60 KHz which would occur if only the SAW 46 were used without reactive elements, i.e., the inductors 44,48. Third, the combination of reactive elements 44, 48 and SAW device 46 produce the desired 90 degree phase shift, at approximately the frequency of minimum insertion loss, for use with the multiplier 42.

Figure 4:
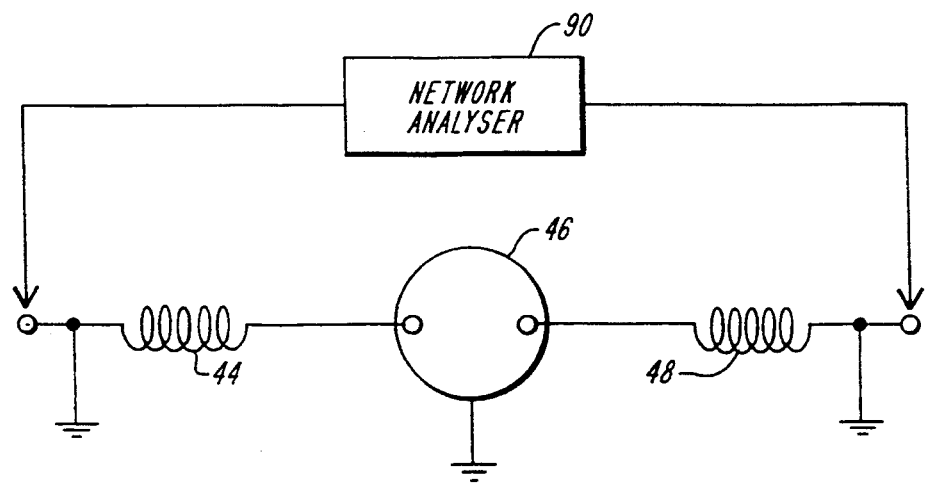
FIG. 4 is a schematic diagram of a circuit used in determining the value of the inductors in the embodiment of the invention shown in FIG. 2.
Figure 5:
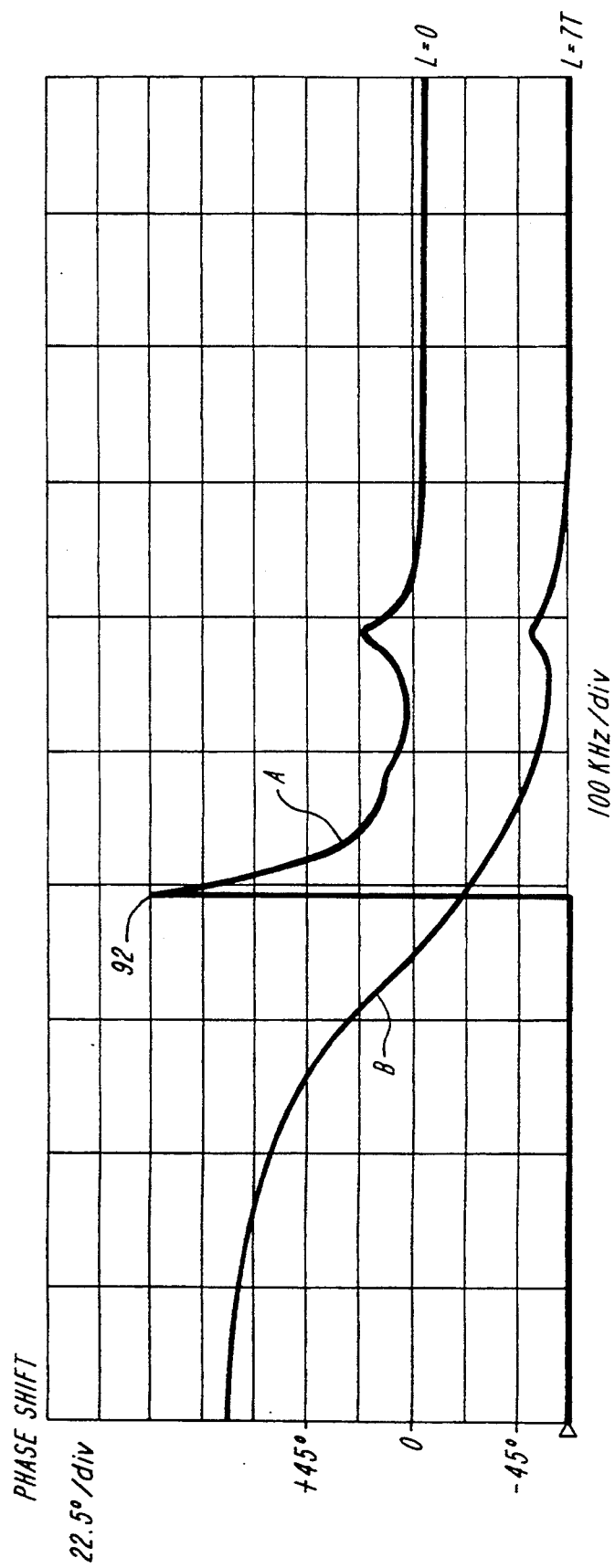
FIG. 5 is a phase diagram of the phase shift induced by the embodiment of the invention in FIG. 2.
Figure 6:
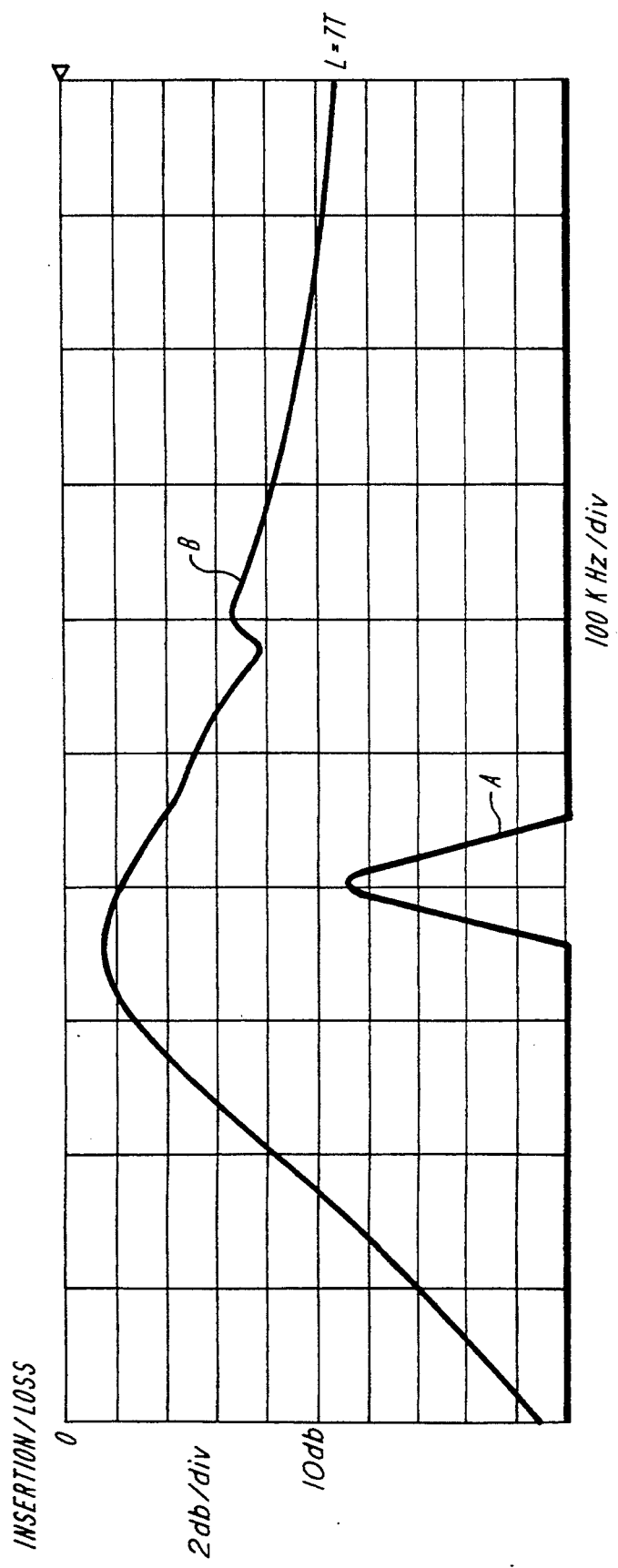
FIG. 6 is an amplitude diagram for the embodiment of the invention shown in FIG. 2.

FIG. 4 depicts a circuit which may be used in choosing the values of inductors 44, 48. The first inductor 44, the SAW device 46, and the second inductor 48 are connected in series and a network analyzer 90 is connected across the series combination. A phase shift versus frequency diagram (FIG. 5) and an amplitude versus frequency diagram (FIG. 6) for various inductor values are generated. In FIGS. 4 and 5 the curves designated A indicate the please shift and insertion loss, respectively, for the SAW device 46, without the inductors 44, 48. As can be seen, the SAW device 46 has a very narrow response curve and generates a large phase shift 92 only at resonance. Such a narrow and high loss response curve may be undesirable. Next, increasing inductance is added in series with the SAW device until the amplitude response curve peaks. The curves indicated by B show the phase shift and amplitude response, respectively, for the same SAW device 46 in series with an inductor laving seven turns. The addition of more inductance with this SAW will result in a decrease in the magnitude of the amplitude response curve. For the SAW device used in this embodiment, inductors 44,48 having values of approximately 200 nH and 250 nH, respectively, produce the highest magnitude amplitude response curve, while at the same time producing a phase shift of about 90 degrees at the resonant frequency of the SAW device 46.

It should be noted that if the insertion loss and narrow bandwidth limitation of the SAW without an inductor is acceptable, the phase shift may deviate from 90 degrees by plus or minus 30 degrees as necessary.

Returning to FIG. 2, the output of the second reactive element 48 is one input to the multiplier 42. In this embodiment, the second input to the multiplier 42 is through one oscillator input 62 of the NE612 integrated circuit. The oscillator input 62 is used rather than the typically used second input terminal 64 of the NE612 chip which, in this application, is grounded through a dc blocking capacitor 66. The oscillator feedback input 68 is allowed to float. Additionally, a low value capacitor 41 is connected between ground and the SAW output to provide a shunt path to very high frequency responses from the phase shifter 43.

The two output terminals 70,72 of the multiplier 42 provide the input signals having opposite phases to the differential amplifier 52 which forms part of the post-detection stage 50. The multiplier 42 produces not only the dc values which are of interest but also a product signal having a frequency of twice the input frequencies. The signal whose frequency is twice the input frequency is removed by a shunting capacitor 53 connected across the output terminals 70,72 of the multiplier 42.

Figure 3:
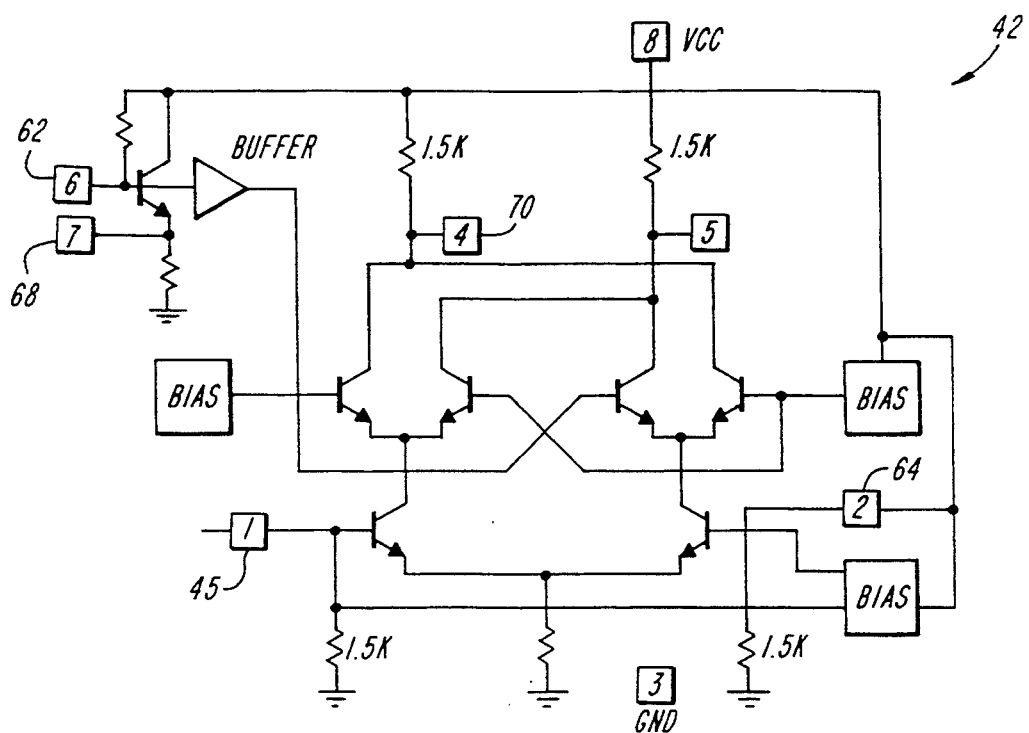
FIG. 3 is a schematic diagram of an embodiment of the multiplier used in the embodiment of the invention in FIG. 2.

The multiplier 42, shown in FIG. 3, is a Gilbert cell multiplier having transistors connected in a hierarchical series of differential pairs. In its standard configuration, a resonator connected between the oscillator terminal 62 and ground would cause the circuit to oscillate. In the present application, the circuit multiplies the signal appearing on the input 60 by the signal appearing on the oscillator terminal 62 and produces, on the output terminals 70,72, output signals which are phase inverted with respect to each other.

One output terminal 72 of the multiplier 42 is ac coupled through a capacitor 54 to one input terminal 57 of the amplifier 52 used in differential mode. The other output terminal 70 of the multiplier 42 is dc coupled to the other input terminal 58 of the amplifier 52. A capacitor 56 is connected across the amplifier 52 to limit the baseband high frequency.

The detected baseband signal appears on the output terminal 59 of the amplifier 52.

These and other examples of the concept of the invention illustrated above are intended by way of example and the actual scope of the invention is to be determined solely from the following claims.

What is claimed is:

1. A radio-frequency detection apparatus comprising:
    a signal input for providing an input signal;
    a phase shifter having a first connection and a second connection, said phase shifter comprising:
        a SAW device having a first electrical connection and a second electrical connection, the SAW first electrical connection coupled to said phase shifter first connection and said SAW second electrical connection coupled to said phase shifter second connection, said SAW device being coupled to said phase shifter first connection through at least one reactive element; and
    a multiplier having a multiplier first input connection, a multiplier second input connection and at least one multiplier output connection,
    said multiplier first input connection being coupled to said signal input and said phase shifter first connection and said multiplier second input connection being coupled to said phase shifter second connection,
    said phase shifter adapted for introducing approximately a 90 degree phase shift into said input signal at approximately the frequency of minimum insertion loss.

2. The apparatus of claim 1 wherein said multiplier having at least one output connection includes first and second output connections.

3. The apparatus of claim 2 wherein a detected signal appears on each of said multiplier first and second output connections and the second multiplier output signal is phase inverted with respect to the first multiplier output signal.

4. The apparatus of claim 1 wherein said phase shifter is dc coupled to said signal input and said multiplier.

5. The apparatus of claim 1 wherein said phase shifter is ac coupled to said signal input and said multiplier.

6. A radio-frequency detection apparatus comprising:
a signal input for providing an input signal;
a phase shifter having a first connection and a second connection, said phase shifter comprising:
   a SAW device having a first electrical connection and a second electrical connection, the SAW first electrical connection coupled to said phase shifter first connection and said SAW second electrical connection coupled to said phase shifter second connection; and
   at least one reactive element coupled in series with said SAW device; and
a multiplier having a multiplier first input connection, a multiplier second input connection and at least one multiplier output connection,
said multiplier first input connection being coupled to said signal input and said phase shifter first connection and said multiplier second input connection being coupled to said phase shifter second connection,
said phase shifter adapted for introducing approximately a 90 degree phase shift into said input signal at approximately the frequency of minimum insertion loss.

7. The apparatus of claim 6 wherein said reactive element comprises at least one inductor having a first electrical connection and a second electrical connection, said second connection of said electrical inductor being coupled to said SAW first electrical connection, and wherein said inductor first electrical connection comprises one of said phase shifter first connection and second connection, and said SAW second electrical connection comprises the other of said phase shifter first connection and second connection.

8. A radio-frequency detection apparatus comprising:
a signal input for providing an input signal;
a phase shifter having a first connection and a second connection, said phase shifter comprising:
   at least one inductor having a first electrical connection and a second electrical connection; and
   a SAW device having a first electrical connection and a second electrical connection, said second connection of said electrical inductor being coupled to said SAW first electrical connection,
   wherein said inductor first electrical connection comprises one of said phase shifter first connection and second connection and said SAW second electrical connection comprises the other of said phase shifter first connection and second connection; and
a multiplier having a multiplier first input connection wherein the coupling between said multiplier first input connection and said signal input produces no significant phase shift, a multiplier second input connection and at least one multiplier output connection,
said multiplier first input connection being directly connected to said signal input and said phase shifter first connection, and said multiplier second input connection being coupled to said phase shifter second connection.

9. A radio-frequency receiver comprising:
an antenna;
a local oscillator multiplier having a local oscillator multiplier first input terminal, a local oscillator multiplier second input terminal and a local oscillator multiplier output terminal, said first local oscillator multiplier input terminal being coupled with said antenna;
a local oscillator, said local oscillator being coupled with said local oscillator multiplier second input terminal;
a bandpass filter amplifier having a bandpass filter amplifier input terminal and a bandpass filter amplifier output terminal, said bandpass filter amplifier input terminal being coupled with said local oscillator multiplier output terminal;
a phase shifter having first connection and second connection, said phase shifter comprising:
   a SAW device having a first electrical terminal and a second electrical terminal, wherein said SAW first electrical terminal is coupled to said phase shifter first connection and said SAW second electrical terminal is coupled to said phase shifter second connection; and
   at least one reactive element having a first electrical connection and a second electrical connection, wherein said second connection of said at least one reactive element is coupled to said SAW first electrical connection, and wherein said at least one reactive element first electrical connection comprises one of said phase shifter first connection and second connection and said SAW second electrical connection comprises the other of said phase shifter first connection and second connection; and
a phase shifter multiplier having a phase shifter multiplier first input terminal, a phase shifter multiplier second input terminal and at least one phase shifter multiplier output terminal,
said phase shifter multiplier first input terminal being coupled to said signal input and said phase shifter first connection, and said phase shifter multiplier second input terminal being coupled to said phase shifter second connection
said phase shifter adapted to introduce approximately a 90 degree phase shift into the input signal at approximately the frequency of minimum insertion loss.

10. The apparatus of claim 9 wherein said radio-frequency receiver further comprises an amplifier having an input terminal and an output terminal wherein said amplifier input terminal is coupled to said antenna and said first local oscillator multiplier input terminal is coupled to said amplifier output terminal.

11. The apparatus of claim 9 wherein said at least one reactive element comprises at least one inductor.

12. The apparatus of claim 9 wherein said SAW device has a resonant frequency approximately at the center frequency of a plurality of frequencies passed by said bandpass filter amplifier.

13. A radio-frequency receiver comprising:
an antenna;
a local oscillator multiplier having a local oscillator multiplier first input terminal, a local oscillator multiplier second input terminal and a local oscillator multiplier output terminal, said first local oscillator multiplier input terminal being coupled with said antenna;

a local oscillator, said local oscillator being coupled with said local oscillator multiplier second input terminal;

a bandpass filter amplifier having a bandpass filter amplifier input terminal and a bandpass filter amplifier output terminal, said bandpass filter amplifier input terminal being coupled with said local oscillator multiplier output terminal;

a phase shifter having a first connection and a second connection, said phase shifter comprising:
  at least one inductor having a first electrical terminal and a second electrical terminal; and
  a SAW device having a first electrical terminal and a second electrical terminal, said second terminal of said electrical inductor being coupled to said SAW first electrical terminal, wherein said inductor first electrical terminal comprises one of said phase shifter first connection and second connection and said SAW second electrical terminal comprises the other of said phase shifter first connection and second connection; and a phase shifter multiplier having a phase shifter multiplier first input terminal, a phase shifter multiplier second input terminal and at least one phase shifter multiplier output terminal, said phase shifter multiplier first input terminal being directly connected to said signal input and said phase shifter first connection and said phase shifter multiplier second input terminal being coupled to said phase shifter second connection.

* * * * *